(12) United States Patent  
Schofield et al.

(10) Patent No.: US 7,821,133 B2
(45) Date of Patent: Oct. 26, 2010

(54) CONTACT PAD STRUCTURE FOR FLIP CHIP SEMICONDUCTOR DIE

(75) Inventors: Hazel D. Schofield, Kent (GB); Slawomir Skocki, Turin (IT); Philip Adamson, Surrey (GB)

(73) Assignee: International Rectifier Corporation, El Segundo, CA (US)

( * ) Notice: Subject to any disclaimer, the term of this patent is extended or adjusted under 35 U.S.C. 154(b) by 516 days.

(21) Appl. No.: 11/586,902

(22) Filed: Oct. 26, 2006

(65) Prior Publication Data

US 2007/0096316 A1     May 3, 2007

Related U.S. Application Data

(60) Provisional application No. 60/731,361, filed on Oct. 28, 2005, provisional application No. 60/773,988, filed on Feb. 16, 2006.

(51) Int. Cl.
*H01L 21/461* (2006.01)
*H01L 29/12* (2006.01)

(52) U.S. Cl. ...................................... 257/738; 438/613

(58) Field of Classification Search ......... 257/736–738, 257/779–782; 438/612–618
See application file for complete search history.

(56) References Cited

U.S. PATENT DOCUMENTS

| | | | |
|---|---|---|---|
| 6,617,237 B1 | 9/2003 | Lee et al. | |
| 6,933,221 B1 * | 8/2005 | Jiang | 438/613 |
| 7,023,027 B2 * | 4/2006 | Teramae et al. | 257/104 |
| 7,129,558 B2 * | 10/2006 | Skocki | 257/484 |
| 7,315,669 B2 * | 1/2008 | Ohtorii | 385/14 |
| 7,358,174 B2 * | 4/2008 | Mis | 438/612 |
| 7,505,239 B2 * | 3/2009 | Kanazawa et al. | 361/56 |
| 2002/0020551 A1 | 2/2002 | Rinne et al. | |
| 2004/0021233 A1 | 2/2004 | Kinzer et al. | |
| 2004/0084770 A1 | 5/2004 | Skocki | |
| 2005/0006789 A1 | 1/2005 | Tomono et al. | |

\* cited by examiner

*Primary Examiner*—Calvin Lee
(74) *Attorney, Agent, or Firm*—Farjami & Farjami LLP

(57) ABSTRACT

A flip chip Schottky die is provided, which includes three contact bumps extending from a top surface of the die for electrically connecting with a board, a first and second bump being cathode contacts, and a third bump being an anode contact and having a larger surface than each of the first and second bumps for a 0.5 ampere device. Each bump is substantially rectangular at its base, but may have a curved or arched top surface on a square die. Also, provided is a contact bump useful in a flip chip device, such as a MOSFET or diode for a current of 1.0 amperes that includes a solder body of PbSn or a solder body free of lead comprising SnAgCu. Such a contact bump is substantially rectangular, and a height of approximately 120 μm.

22 Claims, 5 Drawing Sheets

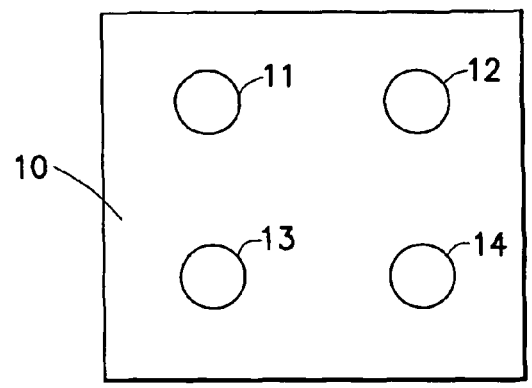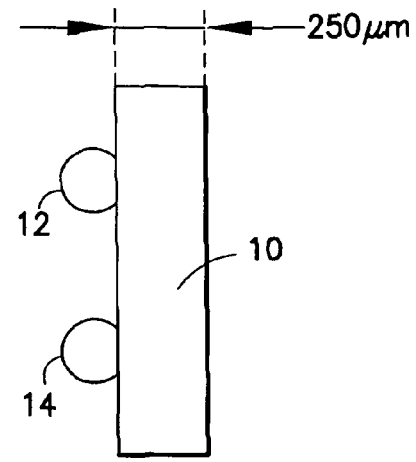
FIG.1
PRIOR ART
FIG.2
PRIOR ART
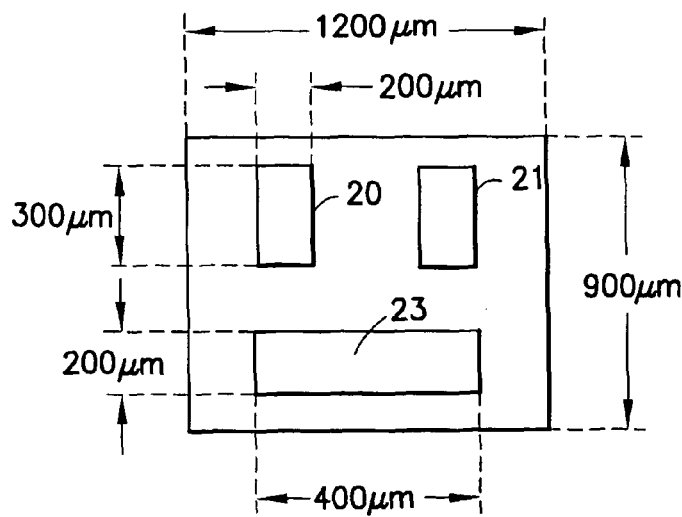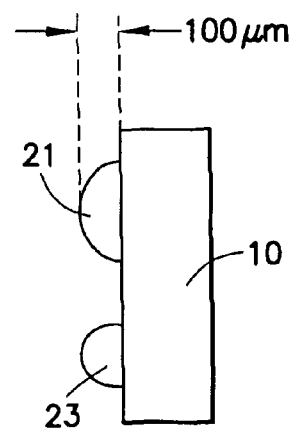
FIG.3
FIG.4

CONTACT PAD STRUCTURE FOR FLIP CHIP SEMICONDUCTOR DIE

RELATED APPLICATIONS

The present application claims priority from U.S. Provisional Application No. 60/731,361 filed on Oct. 28, 2005, for which the inventors are Hazel D. Schofield, Slawomir Skocki and Philip Adamson and U.S. Provisional Application No. 60/773,988 filed on Feb. 16, 2006, for which the inventor is Slawomir Skocki and from. Both U.S. provisional applications are incorporated in full herein by reference.

FIELD OF THE INVENTION

This invention relates to semiconductor devices and more specifically relates to a novel electrical contact bump and a novel electrical contact bump configuration for a schottky device or other miniature flip chip die, including MOSFETs, and other devices.

BACKGROUND OF THE INVENTION

Very small area flip chip die that have several spaced electrical contacts on one surface are well known. Such contacts are typically connected by soldering or the like to corresponding metalized regions on a circuit board or other support board which contains various electrical components with which the die is connected by traces on the board. With the constant push toward miniaturization, semiconductor die are made as small as possible to conserve circuit board area. However, as the die dimensions shrink, the contact areas of the die also shrink, limiting the current capacity of the die and increasing the difficulty of mounting and soldering the device to the board.

Die contacts having a circular topology and a height of about 260 μm have been developed for a FlipFet device by International Rectifier. The solder bumps of such devices may be used for currents of 0.5 to 1.0 amperes.

Also, a flip chip contact structure that can be reduced in area, while still having a relatively high current capacity is in demand. It would be desirable to provide a flip chip diode, which in one embodiment is square and may be about 60 mils on a side, and yet has a contact configuration that permits the die to operate as a 1.0 ampere FLIPKY (a trademark of International Rectifier Corporation) of the kind shown in U.S. Patent Application Publication No. 2004/0084770, filed on Nov. 6, 2002, and U.S. Pat. No. 6,653,740, filed on Feb. 9, 2004. In another embodiment, it would be desirable to provide a flip chip diode that is rectangular with possible dimensions of 1.244×0.914 mm for a 0.5 ampere type FLIPKY or other device.

Thus, the need exists for bump contacts and contact configurations that have low electrical and thermal resistance and do not unduly restrict the current capacity of the die. Also, the need exists for bump contacts and contact configurations that have greater than a minimum shear strength, avoid die tilting during normal use and installation into the circuit board, and avoid bump contact bridging. Higher shear strength improves package robustness when the die is mounted on the board, particularly in applications in which manual handling of the end product may take place. Further, the need exists for a die design that diminishes the chance for solder bridging with the anode pads.

SUMMARY OF THE INVENTION

According to a first embodiment of the present invention, a flip chip schottky die is provided, which includes three contact bumps extending from a top surface of the die for electrically connecting the die with a board, a first bump and a second bump of the three contact bumps being cathode contacts, and a third bump of the three contact bumps being an anode contact and having a larger top surface than each of the top surfaces of the first bump and the second bump. In such a contact bump configuration, each bump of the three contact bumps is substantially rectangular at its base.

In such a bump configuration, each of the three contact bumps may have a substantially curved, curvedly sloped or substantially arched top surface. For example, the soldering process may form a curved top surface for the bumps. The top surface of the first bump and the top surface of the second bump may be approximately equal in area.

Further, the first bump and the second bump may be arranged such that their longer sides are substantially parallel to longer edges of the top surface of the die, and the third bump may be arranged such that its longer sides are substantially parallel to narrower edges of the top surface of the die. By way of example, each bump of the three contact bumps may have a length approximately twice as long as a width of the bump.

In addition, the third bump may have a bump pad or have a bump base of an area substantially equal to 25% of an area of the top surface of the die. The bump pad area of the third bump may be approximately 200 μm×400 μm, and the third bump may have a pitch of approximately 0.7 mm, while the bump pad areas of each the first bump and the second bump may be approximately 200 μm×300 μm.

The surface of the die may include a split cathode pad and may be made of Al, Si and Cu. The three contact bumps may be soldered to the die. Further, the three contact bumps may be formed on the die in a manner free from lead.

The stand-off height of the die yielded by the three contact bumps measured between the board and the die may be approximately 120 μm. The third bump viewed from a side may have a trapezoid profile.

Also provided in a second embodiment is a semiconductor die including an electrical contact bump extending from a top surface of the die and operative to electrically connect the die with a board, and including a solder body of PbSn or a solder body free of lead comprising SnAgCu. Such a contact bump may be substantially rectangular with a curved or substantially arched top.

Such a contact bump may have a height of approximately 120 μm. Also, the contact bump may have a length substantially equal to twice a width of the bump. The bump may include a nickel layer disposed at an opening in a passivation layer at the top surface of the die, and may include a gold flash layer between the solder body and the nickel layer.

According to an aspect of the second embodiment, the die is a flip chip MOSFET.

BRIEF DESCRIPTION OF THE DRAWINGS

FIG. 1 is a schematic top view of a top surface including bump contacts of a flip chip die according to the prior art.

FIG. 2 is a schematic side view of the die and contacts shown in FIG. 1.

FIG. 3 is a schematic top view of a top surface of a die including contacts in a configuration in accordance with a first embodiment of the present invention.

FIG. 4 is a schematic side view of a die and contacts shown in FIG. 3.

DETAILED DESCRIPTION OF THE INVENTION

Figure 5:
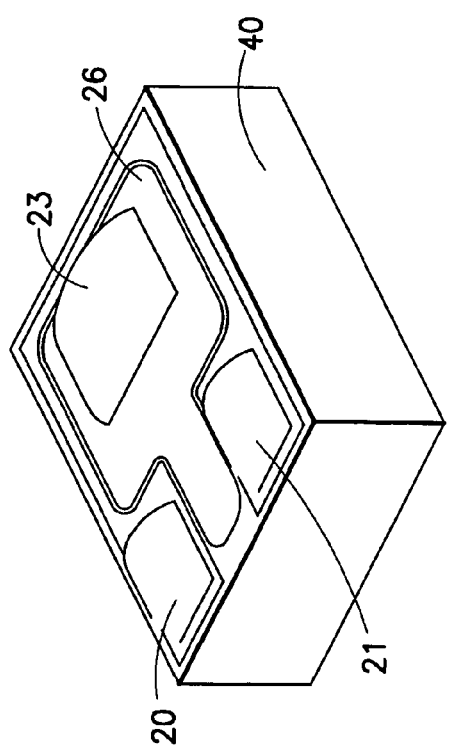
FIG. 5 is a perspective view of a three contact flip chip die according to an aspect of the present invention.

In accordance with a first embodiment of the present invention, a reduced number of bumps, for example three contact bumps, is used. According to the first embodiment of the present invention, a single bump may be used for the anode contact and two bumps may be used for the cathode contact. Preferred metals for the bump pads may be Al Si Cu, and by way of example, the Al may comprise approximately 98.6%, the Si 1%, and the Cu 0.4%. On top of this may be a nickel layer of approximately 5 μm in thickness and a thin flash gold layer. On top of this may be the solder, Which may be of tin and lead, and the tin and lead may comprise, for example, 63% and 37%, respectively. Lead-free solder layers may also be used. The body may also have a solder body comprised of a solder metal alloy such as PbSn, or in a lead-free application, may be comprised of SnAgCu.

FIG. 1 illustrates a prior art Schottky device 10 with four contact bumps 11, 12, 13 and 14. Contact bumps 11 and 12 may be parallel connected on the die interior as cathode (collector) contacts, and contacts 13 and 14 may be parallel connected as anode contacts (connected from the bottom of the die, as by vias or the like). FIG. 2 shows a side view of the die shown in FIG. 1, showing the rounded profile of the bump contacts 12 and 14.

FIG. 3 shows cathode contacts 20 and 21 and anode contact 23 on the top surface of the die according to an aspect of the first embodiment of the present invention. According to an aspect of the present invention, such a die may carry a current of about 0.5 amperes. The three contact bump configuration including cathode contacts 20 and 21 and single anode contact 23 may be useful in Schottky devices, but other types of flip chip devices of a tiny area, could also use such bump contacts. For example such a die may be 1200 μm by 900 μm at its top surface.

As shown in FIG. 3, cathode contacts 20 and 21 are each substantially rectangular at their base, with a relatively curved or curvedly sloped top surface as shown in FIG. 5. Similarly, the single anode contact 23 also has a substantially rectangular shape at its base, with a curved or curvedly sloped top surface as shown in FIG. 5, however the edges near the top surface may be somewhat rounded and the top surface may be somewhat curvedly sloped as shown in FIG. 5.

According to an aspect of the first embodiment of the present invention, the anode contact 23 has a bump pad area or a bump base area equal to approximately 25% of the full die top surface. Also shown in FIG. 3 are exemplary dimensions illustrating the scale of the structures and their relationship. Thus, according to this exemplary embodiment, cathode contacts 20 and 21 have lengths of 300 μm each and a width of approximately 200 μm, and the anode contact 23 has a length of approximately 400 μm and a width of approximately 200 μm. It will be understood that cathode contacts 20 and 21, an anode contact 23, and a die 40 with different measurements may also be used without departing from the spirit of the present invention.

FIG. 4 shows a side view of the die illustrated in FIG. 3 with the cathode contact 21 and the anode contact 23. Also shown in FIG. 3 is that consistent with the above-provided exemplary embodiment, the approximate height of the contact bumps may be 100 μm.

FIG. 5 is a perspective view of the die 40, the cathode contacts 20 and 21 and the anode contact 23 according to the first embodiment of the present invention. FIG. 5 also shows the anode pad 26 which receives the anode contact 23.

Figure 6:
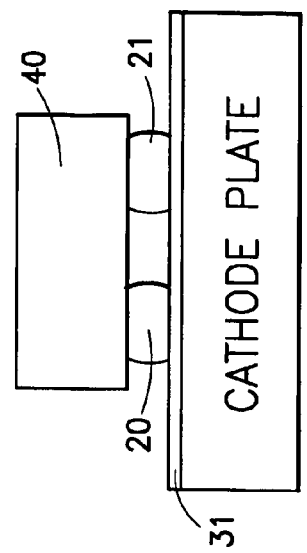
FIG. 6 is a side view of the device shown in FIG. 5 showing the anode contact mounted on a circuit board according to an aspect of the present invention.

FIG. 6 is a side view of the die 40 with the anode contact 23 mounted on the circuit board 31. As shown in FIG. 6, the sides of the anode contact 23 may be inclined with respect to the top surface of the die 40.

Figure 7:
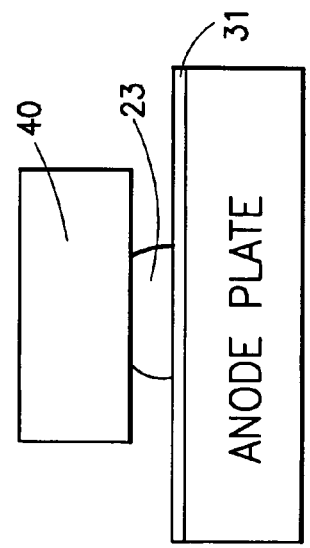
FIG. 7 is a side view of the die shown in FIG. 5 showing the cathode contacts mounted on a circuit board according to an aspect of the present invention.

FIG. 7 shows a side view of the cathode contacts 20 and 21 extending from the die 40 and mounted to the circuit board 31. The cathode contacts 20 and 21 are shown as being substantially rectangular in the mounted position.

Figure 8:
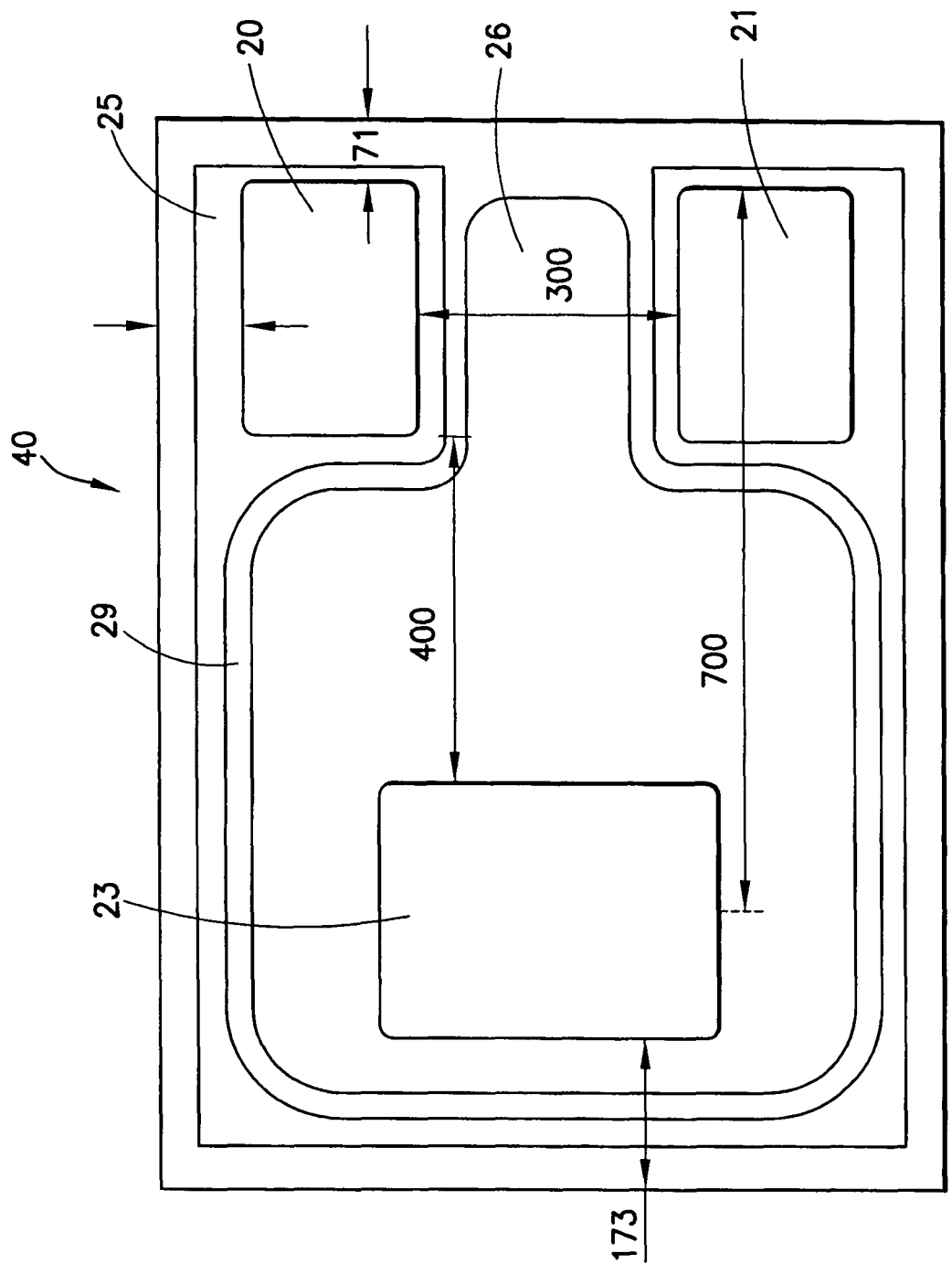
FIG. 8 is a top view of the die shown in FIG. 5 with the contact pads and the silicon to which they are connected, and the gap between them according to an aspect of the present invention.

FIG. 8 shows the top surface of the die 40 including the anode pad 26 (the silicon anode surface) separated by gap 29 from the cathode pad 25 (the silicon cathode surface). Cathode pad 25 receives the cathode contacts 20 and 21 as shown, while the anode contact 23 is formed on the anode pad 26.

The die 40 is shown as having a substantially rectangular top surface, with longer sides of the anode contact 23 arranged parallel to the narrower sides of the die 40 and the longer sides of the cathode contacts 20 and 21 extending parallel to the longer sides of the die 40.

Also, FIG. 8 shows an example of the dimensions of the die according to the first embodiment of the present invention but varies from the square of FIG. 3. These dimensions are exemplary dimensions only to illustrate the scale of the structures and their relationships, however it will be understood that cathode contacts, an anode contact, and a die with different measurements may also be used without departing from the spirit of the present invention. The distance between the anode contact 23 and the closest narrower side of the die 40 is approximately 173 μm, the distance from each of the cathode contacts 20 and 21 and the closest narrower side of the die 40 is approximately 71 μm, and the distance between each of the cathode contacts 20 and 21 and the anode contact 23 is approximately 400 μm. Also, according to this example, the distance between each of the centers of the cathode contacts 20 and 21 and the center of the anode contact 23 is approximately 700 μm, while the distance between the cathode contact 20 and the cathode contact 21 is approximately 300 μm.

Thus, according to an aspect of the invention, a forward voltage drop is minimized and an improved bump shear force and a respectable minimum bump pitch is achieved. According to an aspect of the first embodiment of the present invention, the anode bump has a surface area of approximately 300 μm×400 μm and the two cathode bumps each have a surface area of approximately 200 μm ×300 μm with a bump pitch of 0.7 mm and 0.5 mm.

In accordance with the second embodiment of the present invention, a substantially rectangular contact bump is provided for applications up to approximately 1.0 amperes and may be used for Schottky, MOSFET and other types of devices. The second embodiment is not directed to a specific contact bump configuration of several contact bumps but to the structure of the contact bump.

When a die carries a current greater than approximately 0.5 amperes, a reduced thermal and electrical resistance is typically required.

Figure 9:
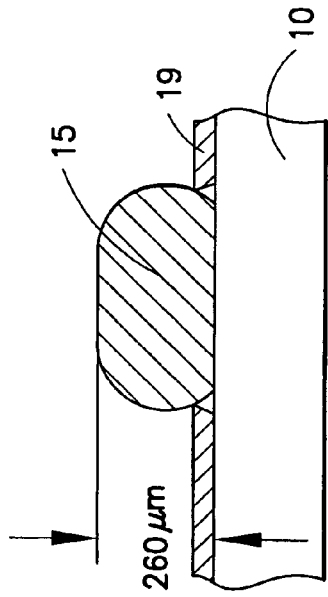
FIG. 9 is a schematic illustration of a top view of a die including contact bumps and their respective contact openings in a passivation layer according to the prior art.

FIG. 9 shows the conventional contact bumps 15, 16, 17 and 18, which may provide for gate, drain and source contacts on a top of a flip chip device, such as a MOSFET or a FLIPFET™ device. Any desired number of bumps may be used without departing from the spirit of the second embodiment of the present invention. The contact bumps 15, 16, 17 and 18 are electrically connected internally to various regions of a silicon die 10 in which all contacts are available at the top surface of the die. The contact bumps 15, 16, 17 and 18 are connected to appropriate regions of the die 10 through openings or windows in the passivation layer 19.

Figure 10:
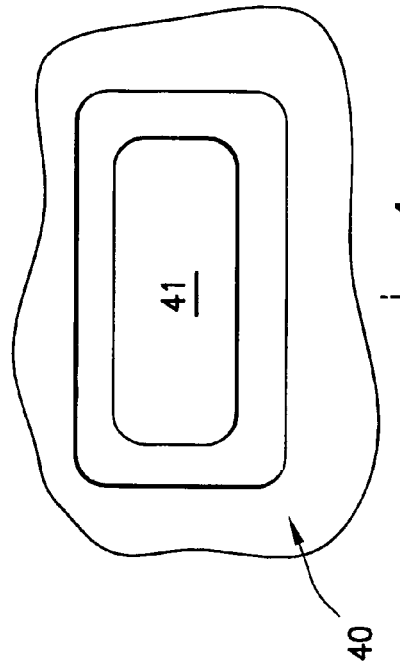
FIG. 10 is a schematic sectional view of the die shown in FIG. 9 including contact bumps.

The bump shown in FIGS. 9 and 10 may have a height of approximately 260 μm. The contact bump 15 is shown in FIG. 10 as having a substantially round cross section.

A second embodiment of the present invention will now be described with reference to FIGS. 11-13 which is preferably used for devices which are noted at up to about 1.0 amperes.

Figure 11:
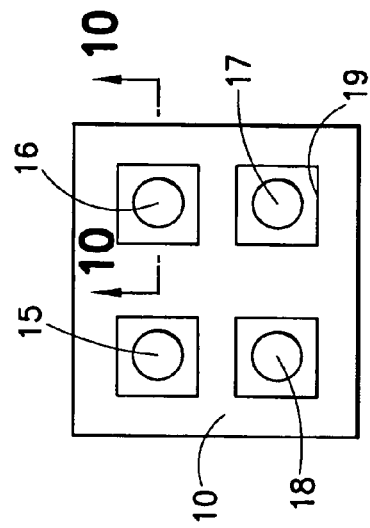
FIG. 11 is a schematic illustration of a sectional view of a die and a contact bump with a substantially rectangular topology according to an aspect of the present invention.

FIG. 11 shows a contact bump 41 according to a second embodiment of the present invention. The contact bump 41 may have a height of approximately 120 μm measured from the top surface of the die 40 such that the distance includes the depth of the passivation layer 19. The passivation layer may be comprised, for example, of $Si_3N_4$.

The length of rectangular contact bump 41 is approximately twice its width and the bump has a reduced height of approximately 120 μm. The contact bump has a fatter body, for example, made of PbSn or a lead-free solder body comprising SnAgCu. However, other solder alloys may be used for the solder body of the contact bump.

Figure 12:
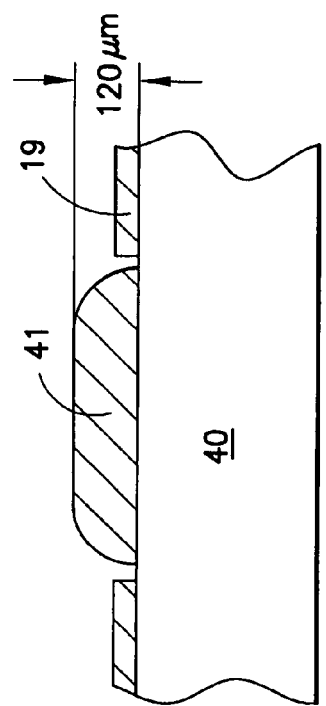
FIG. 12 is a schematic illustration of a top view of the substantially rectangular contact bump shown in FIG. 11.

FIG. 12 shows the top view of the contact bump 41 illustrated as having a substantially rectangular shape with rounded edges, and/or with a rounded or curvedly sloping top surface as shown in FIG. 11.

Figure 13:
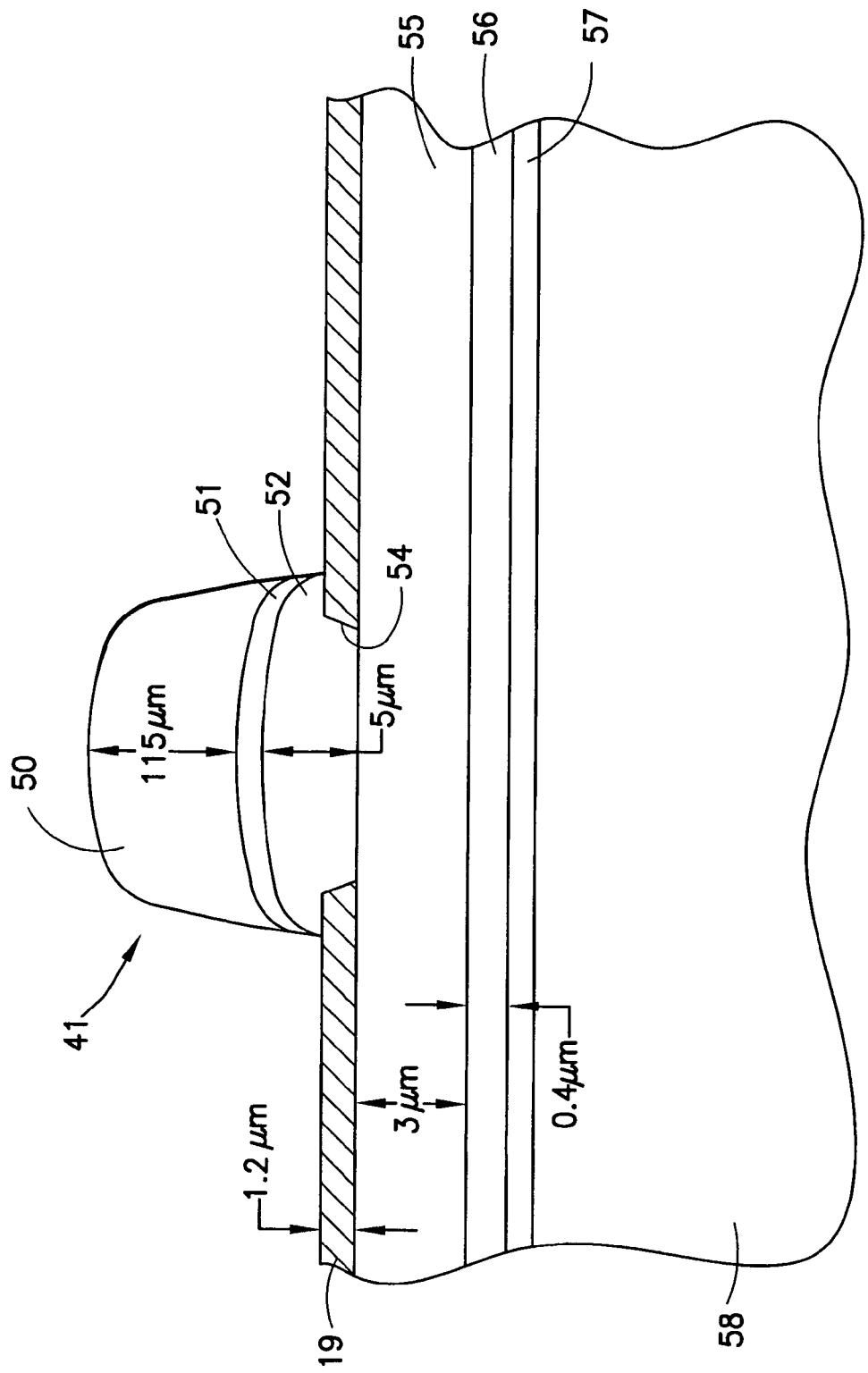
FIG. 13 is a schematic illustration of a sectional view of the die including the contact bump shown in FIG. 12 according to an aspect of the present invention.

The contact bump 41 includes a solder body 50 as shown in FIG. 13. The solder body 50 may be comprised of a solder metal alloy such as PbSn, or in a lead-free application, may be comprised of SnAgCu.

As shown in FIG. 13, the die 40 has a silicon substrate 58 on top of which is formed a palladium silicide (PdSi), nickel silicide, or platinum silicide layer 57, on top of which may be formed a molybdenum, titanium or tungsten layer 56, on top of which may be formed an AlSiCu layer 55. The passivation layer 19 is formed atop this AlSiCu layer 55, however the passivation layer window 54 is provided to allow for a direct electrical contact between the bottom of the contact bump 41 and the AlSiCu layer 55.

The bottom of the contact bump 41 may be a nickel layer 52. Between the solder body 50 and the nickel layer 52 of the contact bump 41 is a thin flash gold layer 51.

Also shown in FIG. 13 is an example of possible dimensions of the substantially square die 40 of approximately 60 mils on each side, and the contact bump 41 for purposes of illustration of the scale of the structures and the relationships between them. However, it will be understood that other dimensions may be safely used without departing from the spirit of the present invention. In the example provided in FIG. 13, the molybdenum layer 56 has a depth of approximately 0.4 μm, AlSiCu layer 55 has a depth of approximately 3 μm, the passivation layer 19 has a depth of approximately 1.2 μm, the nickel layer 52 of the contact bump has a height of approximately 5 μm, and the solder body has a height of approximately 115 μm.

Although the present invention has been described in relation to particular embodiments thereof, many other variations and modifications and other uses will become apparent to those skilled in the art. It is preferred, therefore, that the present invention be limited not by the specific disclosure herein.

We claim:

1. A semiconductor die comprising:
    an electrical contact bump extending from a top surface of the die and operative to electrically connect the die with a board; and
    the bump including one of a solder body comprising PbSn or a solder body free of lead comprising SnAgCu,
    wherein the bump has a substantially rectangular base with a curved or arched top, the bump having a length substantially equal to twice a width of the bump.

2. The semiconductor die of claim 1, wherein the bump has a height of approximately 120 mm.

3. The semiconductor die of claim 1, wherein the top surface of the die further comprises a second electrical contact bump, a third electrical contact bump, and a fourth electrical contact bump extending from the die and each operative to electrically connect with the board, each substantially identical in structure to the first electrical contact bump.

4. The semiconductor die of claim 1, wherein the bump comprises a nickel layer disposed at an opening in a passivation layer at the top surface of the die.

5. The semiconductor die of claim 1, wherein the bump comprises a gold flash layer between the solder body and the nickel layer.

6. The semiconductor die of claim 1, wherein the die is a flip chip MOSFET operable at 1.0 amperes.

7. A flip chip semiconductor device die having a reduced contact bump count no greater than three, comprising:
    three contact bumps extending from a top surface of the die for electrically connecting the die with a board;
    a first bump and a second bump of the three contact bumps being cathode contacts; and
    a third bump of the three contact bumps being an anode contact and having a larger top surface than each of the top surfaces of the first bump and the second bump,
    wherein each bump of the three contact bumps is substantially rectangular at its base with a length approximately twice as long as a width for each bump.

8. The die of claim 7, wherein each bump of the three contact bumps has a substantially curved or substantially arched top surface.

9. The die of claim 7, wherein the top surface of the first bump and the top surface of the second bump are approximately equal in area.

10. The die of claim 7, wherein the first bump and the second bump are disposed such that their longer sides are substantially parallel to longer edges of the top surface of the die, and the third bump is disposed such that its longer sides are substantially parallel to narrower edges of the top surface of the die.

11. The die of claim 7, wherein a top of the third bump has an area substantially equal to 25% of an area of the top surface of the die.

12. The die of claim 7, wherein the third bump is approximately 200 mm×400 mm.

13. The die of claim 7, wherein the third bump has a pitch of Approximately 0.7 mm from a center of the second bump.

14. The die of claim 7, wherein the first bump and the second bump are each approximately 200 mm×300 mm.

15. The die of claim 7, wherein each of the first bump and the second bump has a pitch of approximately 0.5 mm from a center of the second bump and the first bump, respectively.

16. The die of claim 7, wherein the top surface of the die comprises a split cathode pad.

17. The die of claim 7, wherein the top surface of the die comprises Al, Si and Cu.

18. The die of claim 7, wherein the three contact bumps are soldered to the die.

19. The die of claim 7, wherein the three contact bumps are formed on the die in a manner free from lead.

20. The die of claim 7, wherein the die comprises a flip chip Schottky diode.

21. The die of claim 7, wherein a stand-off height yielded by the three contact bumps measured between the board and the die is approximately 120 mm.

22. The die of claim 7, wherein each bump comprises one of a solder body including PbSn or a solder body free of lead including SnAgCu,
wherein the bump has a substantially rectangular base and a curved or substantially arched top.

* * * * *